United States Patent
Graves et al.

(10) Patent No.: US 10,452,472 B1
(45) Date of Patent: Oct. 22, 2019

(54) TUNABLE AND DYNAMICALLY ADJUSTABLE ERROR CORRECTION FOR MEMRISTOR CROSSBARS

(71) Applicant: HEWLETT PACKARD ENTERPRISE DEVELOPMENT LP, Houston, TX (US)

(72) Inventors: Catherine Graves, Palo Alto, CA (US); John Paul Strachan, Palo Alto, CA (US); Dejan S. Milojicic, Palo Alto, CA (US); Paolo Faraboschi, Palo Alto, CA (US); Martin Foltin, Palo Alto, CA (US); Sergey Serebryakov, Palo Alto, CA (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 0 days.

(21) Appl. No.: 15/997,030

(22) Filed: Jun. 4, 2018

(51) Int. Cl.
*H03M 13/00* (2006.01)
*G06F 11/10* (2006.01)
(Continued)

(52) U.S. Cl.
CPC ...... *G06F 11/1048* (2013.01); *G06F 11/1044* (2013.01); *H03M 13/09* (2013.01); *H03M 13/35* (2013.01)

(58) Field of Classification Search
CPC ............. G06F 11/1048; G06F 11/1044; G06F 11/1008; G06F 11/102; G06F 11/10;
(Continued)

(56) References Cited

U.S. PATENT DOCUMENTS 6,934,305 B1 * 8/2005 Duschatko ............ H04L 45/583
370/503
7,739,576 B2 6/2010 Radke
(Continued)

OTHER PUBLICATIONS

Yoon, D.H. et al.; "Mage: Adaptive Granularity and ECC for Resilient and Power Efficient Memory Systems"; Nov. 2012; 12 pages.
(Continued)

*Primary Examiner* — Christine T. Tu
(74) *Attorney, Agent, or Firm* — Nolte Intellectual Property Law Group (57) ABSTRACT

A dot-product engine (DPE) implemented on an integrated circuit as a crossbar array (CA) includes memory elements comprising a memristor and a transistor in series. A crossbar with N rows, M columns may have N×M memory elements. A vector input for N voltage inputs to the CA and a vector output for M voltage outputs from the CA. An analog-to-digital converter (ADC) and/or a digital-to-analog converter (DAC) may be coupled to each input/output register. Values representing a first matrix may be stored in the CA. Voltages/currents representing a second matrix may be applied to the crossbar. Ohm's Law and Kirchoff's Law may be used to determine values representing the dot-product as read from the crossbar. A portion of the crossbar may perform Error-correcting Codes (ECC) concurrently with calculating the dot-product results. ECC codes may be used to only indicate detection of errors, or for both detection and correction of results.

20 Claims, 7 Drawing Sheets

(51) Int. Cl.
*H03M 13/09* (2006.01)
*H03M 13/35* (2006.01)

(58) Field of Classification Search
CPC .... G11C 29/52; G11C 13/0002; H03M 13/09; H03M 13/35
See application file for complete search history.

(56) References Cited

U.S. PATENT DOCUMENTS

| | | |
|---|---|---|
| 8,122,323 B2 | 2/2012 | Leung et al. |
| 8,898,548 B1 | 11/2014 | Mullendore et al. |
| 2017/0019978 A1 | 1/2017 | Lashina et al. |
| 2018/0253643 A1* | 9/2018 | Buchanan ............ G06N 3/0635 |
| 2019/0034268 A1* | 1/2019 | Roth ................... G06F 11/1068 |
| 2019/0035449 A1* | 1/2019 | Saida .................. G11C 11/1675 |

OTHER PUBLICATIONS

Hu, Y-P. et al.; "An Elastic Error Correction Code Technique for NAND Flash-based Consumer Electronic Devices"; Apr. 4, 2013; 8 pages.

* cited by examiner

| ECC PRECISION | ECC ROW(S) | DPE MATRIX SIZE | DOT PRODUCT MATRIX SIZE |
|---|---|---|---|
| NONE | Z=0 | N x M | ANY <= N x M |
| LOW | Z=1 | N x M | ANY <= N x M-1 |
| MED | Z=2-3 | N x M | ANY <= N x M-Z |
| HIGH | Z=3-6 | N x M | ANY <= N x M-Z |
| HIGHEST | ALL AVAILABLE Z=M-B | N x M | A x B, WHERE A<= N AND B <= M-Z |

TABLE 1

TUNABLE AND DYNAMICALLY ADJUSTABLE ERROR CORRECTION FOR MEMRISTOR CROSSBARS

BACKGROUND

A dot-product engine (DPE) may be implemented on an integrated circuit (IC) as a crossbar array that includes memory elements at each crossbar intersection. Memory elements may include a memristor and a transistor in series to store an input voltage and/or current value. A crossbar with N rows, M columns may have N×M memory elements that may be used to calculate the dot-product (matrix multiplication) of two matrices of up to an N×M size. The IC may provide a vector input for N voltage inputs to the crossbar array and a vector output for M voltage outputs from the crossbar array. The IC may further include an analog-to-digital converter (ADC) and/or a digital-to-analog converter (DAC) coupled to each input/output register. Values representative of a first matrix may be stored in the crossbar array as a programmable resistance value. Voltages/currents representative of a second matrix may be applied to the crossbar. Ohm's Law and Kirchoff's Law may be used in calculations to determine values representative of the dot-product as read from outputs of the crossbar. In this manner, a DPE allows for in situ calculation of the dot-product of two matrices. The DPE engine represents an analog computation device. A memristor crossbar array structure can carry out vector-matrix multiplication. By applying a vector of voltage signals to the rows of a memristor crossbar array, multiplication by each element's programmed conductance is carried out. The memristor crossbar array structure may be further configured to accelerate performance of vector data set calculations over traditional digital ASIC processing.

In digital computation devices, error-correcting code memory (ECC memory) is a type of computer data storage that can detect and correct the most common kinds of internal data corruption associated with digital data. ECC memory is used in most computers where digital data corruption results in potentially serious consequences, such as for scientific or financial computing. ECC memory may be more expensive than non-ECC memory and may require more overhead, e.g., more computational cycles or power requirements, etc. Conventional ECC memory and ECC techniques for digital computation are simply not applicable to analog computational models, however analog computational modules may also benefit from a similar application of ECC methodology, but wholly different implementation, to address any corruption that may be present in the analog domain (e.g., noise induced corruption).

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

DETAILED DESCRIPTION

Examples of the subject matter claimed below will now be disclosed. In the interest of clarity, not all features of an actual implementation are described in this specification. It will be appreciated that in the development of any such actual example, numerous implementation-specific decisions may be made to achieve the developer's specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Embodiments of the present disclosure are directed to a memristive dot-product system for vector processing, and related method and non-transitory computer storage device storing instructions operable to cause one or more computer processors to perform the method.

In one embodiment, a crossbar array includes a number of memory elements. Each memory element may include a memristor and a transistor in series with one another. The crossbar array has N rows, M columns and N×M memory elements. A vector input register has N voltage inputs to the crossbar array. A vector output register has M voltage outputs from the crossbar array. An analog-to-digital converter (ADC) may be electronically coupled to the vector output register. A digital-to-analog converter (DAC) may be electronically coupled to the vector input register. As stated above, the disclosed crossbar array may be used to calculate the dot-product of two matrices up to N×M in size. However, there are times a dot-product may need to be calculated for a smaller input and output matrix. Accordingly, some number less than N and M will be used to perform the dot-product calculation (e.g., only a portion of the crossbar array). Disclosed ECC techniques may be used to calculate ECC for the analog calculation provided for by the crossbar. That is, the unused rows and columns of the crossbar may be utilized concurrently with the calculation to provide in situ ECC values for the calculations read as results from the crossbar elements.

Disclosed embodiments of Error-correcting Codes (ECC) for analog computing provide the ability to correct and detect computational errors while using dot-product engines for vector-matrix multiplication. These ECC's can detect and correct analog computation errors natively in DPE crossbar arrays while concurrently performing vector-matrix multiplication. The concurrent nature of the disclosed ECC method is provided, in part, by provisioning an area of the crossbar (A") that is programmed to find and correct computation errors irrespective of the applied vector for the multiplication. That is, A", in some implementations, is only dependent on the desired computation matrix A'. In a number of uses that may benefit from a DPE implementation, the DPE may be designed and used for workloads where A' does not change frequently. In these situations, for example, it may be possible that A" (that is the memristors storing information for ECC calculations) may be programmed with a conductance value once at the same time that A' is programmed into the DPE crossbar array.

As explained further below, the size of A" may be tunable and set in accordance with a library size for the analog computation (i.e. number of levels/bits desired for a degree of accuracy in the computation). In this manner, the number of errors that the ECC code can find, $\tau$, and the upper bound on the error, $\Delta$, may be tuned dynamically for the desired error correction.

This disclosure provides an improvement to the technical area of DPE computational accuracy with corresponding concern for executional overhead (e.g., area used, power, accuracy). In general, to minimize the overhead required for ECC (through minimizing the size of A") may result in a more efficient, but still accurate, calculation. Accordingly, disclosed embodiments may allow for the application, layers, and operations to be set by the user for different calculations as needed. By allowing the user to tune and adjust the required computational precision, they may also set $\tau$ and $\Delta$ for the desired application or application layers. This may be further adjusted at the core and tile levels simply by setting the size of A" provisioned for the ECC (See FIGS. 1A-B and 2). Other possible techniques that may be used in conjunction with the disclosed dynamic ECC technique, but may not be necessary, in part, because they are expected to unnecessarily increase overhead include: offline quantization; redundancy or replication of selected full computations; or only allowing for uniform (all layers identical) precision across the system. However, each of these other techniques may not provide the overall benefits of the disclosed dynamically tunable ECC method.

Certain applications and also layers or operations within applications may have different precision requirements. Accordingly, these applications may also utilize the techniques of this disclosure to set different requirements for the error correction ($\tau$, $\Delta$). As an example, after training neural network weights with 32-bit precision, a typical approach may be to reduce parameter precision to 16 or 8 bits to cause a corresponding result of saving power and reducing the required memory. Disclosed example embodiments, may provide for a variable ECC code scheme where the size of ($\tau$, $\Delta$), that determine the error correction degree, may be varied as necessary along with Core and with Tile depending on the application's requirements. That is, the user and the library may have an effect on how the ECC processing is dynamically tuned throughout an overall set of potentially related calculations (e.g., a processing pipeline).

In the application of embodiments of the disclosed architecture(s), certain tiles and/or cores can be provisioned for larger vs. smaller A" areas to yield areas designed for greater or smaller degrees of error correction. During the provisioning step, the application can then be mapped as appropriate to the desired tiles given the user's desired analog level number (i.e. alphabet size, representing the number of possible valid values) and desired precision (See FIGS. 1A-B and 2).

In some implementations and for some types of computational pipelines, the degree of error correction may be dynamically adjusted on-the-fly. For example, an initial A" area may be initially provisioned, but during run-time this could be reduced, effectively de-activating a fraction of the array and turning down the degree of error correction. This would be the case if the application initially begins with a conservatively high precision (a lot of error correction), but slowly turns this down as it is discovered exactly how much precision is actually required. In one example, the system may determine that less precision is actually required by keeping track of the number of errors detected or corrected for different stages of an application pipeline. If, overtime, a particular stage of the application pipeline is determined to need less error correction, the system may reduce the error correction degree for that stage on future passes through the pipeline. Other ECC schemes for analog computation in DPE have been proposed but they may be costly to implement in terms of extra DPE memristor crossbar area and peripheral circuits (and therefore power). In contrast, by dynamically varying degree of error correction depending on the application requirements overall efficiencies may be improved.

Figure 1A:
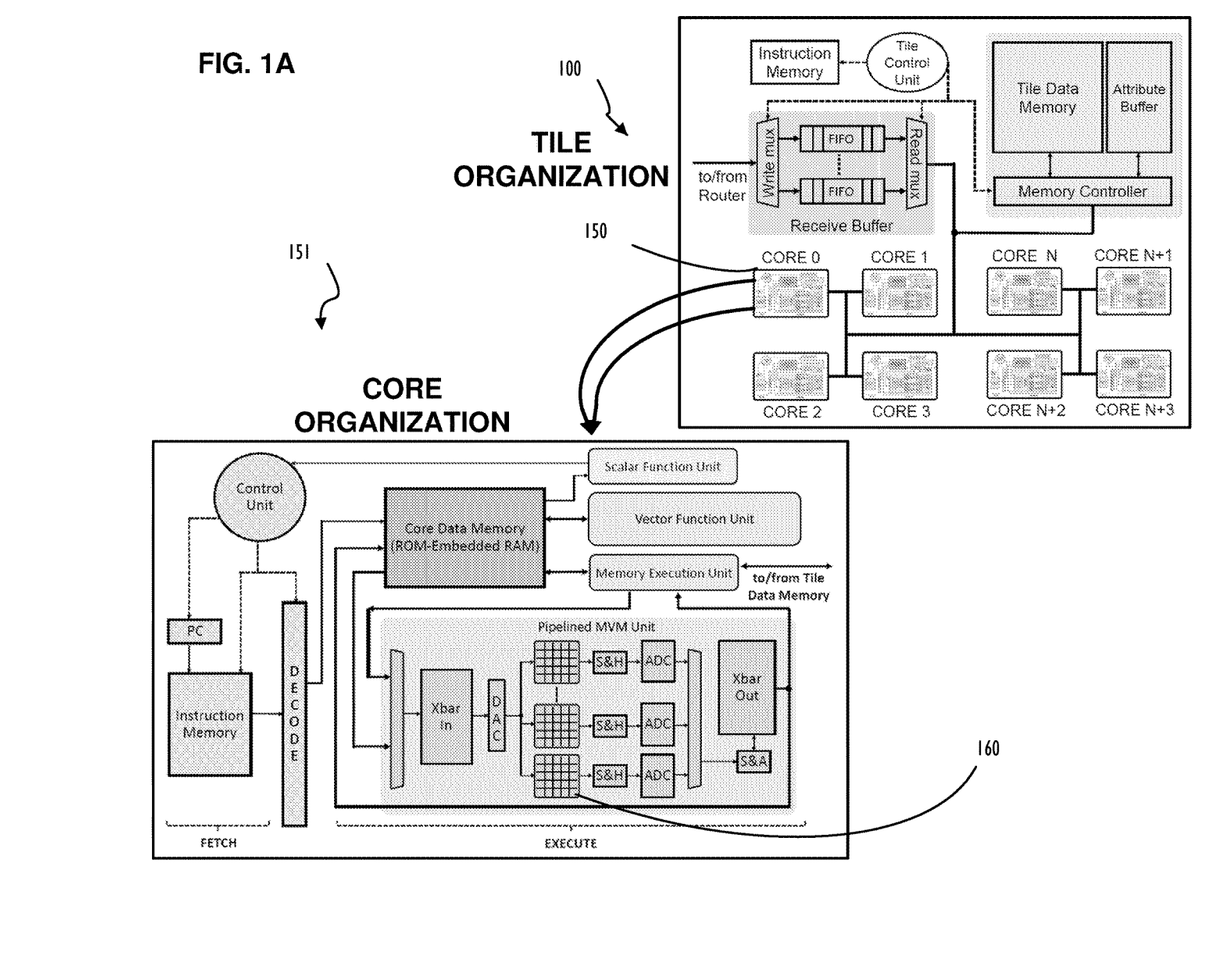
FIG. 1A is a block diagram representing one possible tile organization on an integrated circuit (IC) and a core organization for an example core from a possible plurality of cores on the IC, according to one or more disclosed embodiments.

Referring now to FIG. 1A, an example memristive crossbar array is now described for use in dot-product matrix calculations with dynamically tunable ECC as discussed above. While a particular example of a memristive crossbar array is described, other configurations of memristive crossbar arrays may be used. FIG. 1A illustrates a memristive dot-product engine (DPE) 160 in the context of an integrated circuit (IC), also referred to as the dot-product system, configured as part of a pipelined Matrix Vector Multiplications (MVM) Unit. DPE 160 is shown using a schematic diagram in FIG. 1B and another example of a dot-product engine similar to DPE 160 is shown and discussed in more detail in FIG. 2 below.

In the context of an integrated circuit (IC) there are many possible tile organizations and hardware module components may be arranged in many different ways based on the requirements of the particular IC being designed or fabricated. IC 100 is illustrated in FIG. 1A with a plurality of cores labeled CORE 0 (150) through CORE 3 and CORE N through CORE N+3. Multiple cores may be used to perform functions on a given IC in parallel and may also be used to implement a system on a chip (SOC) processing unit. Each core may be organized consistently with other cores on the same IC or different cores may be designed and implemented to perform different functions. At run-time it may be possible to select a particular core to execute a given task or some tasks may be portable across almost all cores (if not all). Core organization 151 illustrates how a core including a crossbar matrix may be implemented. Many different implementations are possible.

DPE 160 may be implemented as part of another processor and may be integrated into or communicatively coupled to one or more central processing units (CPUs), semiconductor-based microprocessors, and/or other hardware devices suitable for retrieval and execution of instructions stored in machine-readable storage medium. The processor equipped with a DPE may fetch, decode, and execute instructions, to control processes for performing matrix multiplication with dynamic ECC on the crossbar array. As an alternative or in addition to retrieving, and executing instructions, the DPE enabled processor may include one or more electronic circuits that include electronic components for performing the functionality of one or more instructions, e.g., a Field Programmable Gate Array (FPGA) or Application Specific Integrated Circuit (ASIC). The processor may further include memory for storing executable instructions, and/or couple to a separate storage medium. The processor may be electronically coupled via electronic circuit to a DAC to program a column of the crossbar array 200. The processor may be electronically coupled via electronic circuit to a DAC to apply data values as voltages to the crossbar array. The processor may be electronically coupled via an electronic circuit to an ADC to receive an output from the crossbar array 200. The processor may be electrically coupled to a memory register or cache to retrieve input vector data. The data may be static, or may be updated periodically, for example in streaming context.

Figure 1B:
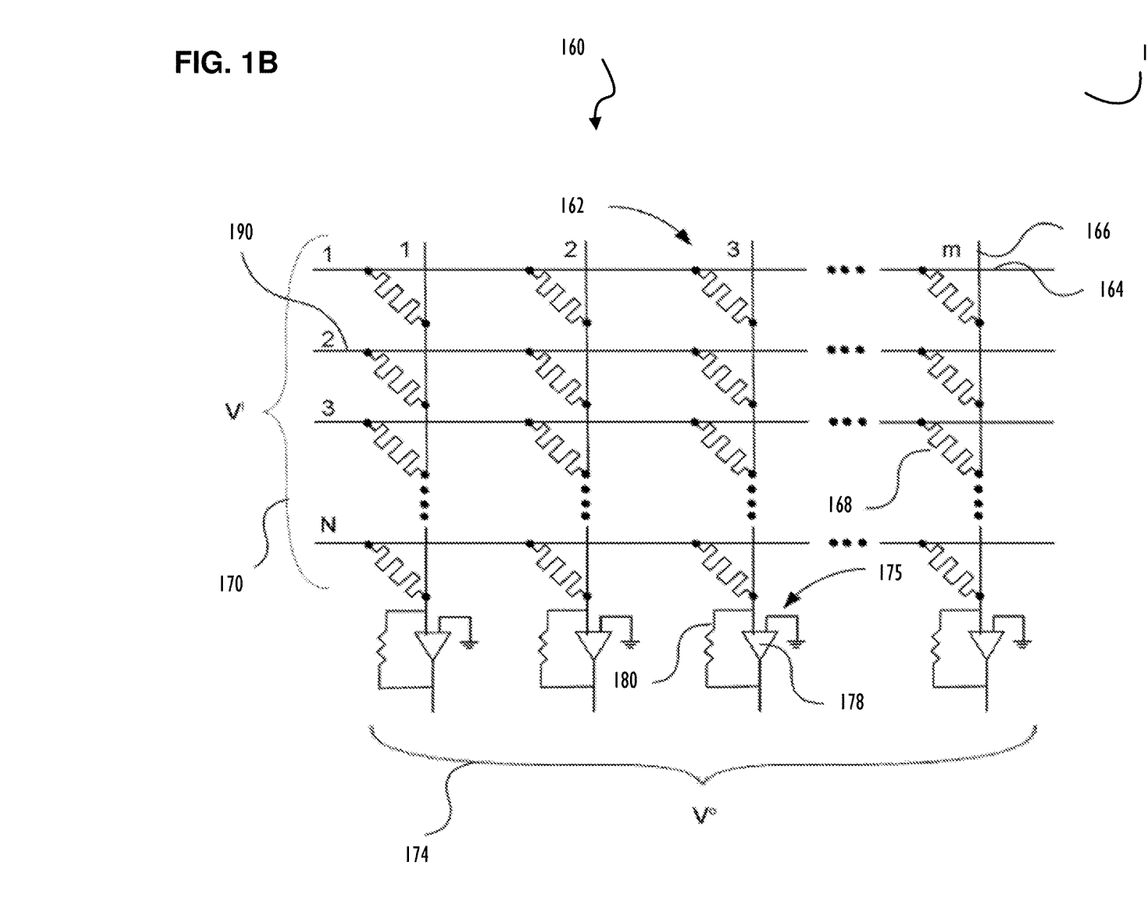
FIG. 1B is a schematic view of an example DPE for an IC as shown in FIG. 1A, according to one or more disclosed embodiments.

Referring now to FIG. 1B, DPE 160 is illustrated with an example schematic view including some of the functional elements (e.g., hardware components and logic) discussed above. DPE 160 is only an example and not intended to represent all possible schematic implementations for a DPE that may be used to implement disclosed principles. DPE 160 is illustrated as having a single vector of voltage inputs according to one example of the principles disclosed herein.

DPE 160 includes a crossbar array 162 including N row electrodes 164 and M column electrodes 166. The crossbar junctions throughout the crossbar array 162 include a memristive element 168. DPE 160 includes a vector input register or vector input 160 for applying voltages to the row electrodes 164 and a vector output register or vector output 174 for receiving output voltages resulting from current flows in the column electrodes 166. DPE 160 also includes sense circuitry 176 for converting an electrical current in a column electrode 166 to a voltage. In an example of the principles described herein, the sense circuitry 176 includes an operational amplifier 178 and a resistor 180, which can be arranged to represent a virtual ground for read operations.

DPE 160 may also include other peripheral circuitry associated with crossbar arrays 162 used as storage devices. For example, the vector input 170 may include drivers connected to the row electrodes 164. An address decoder can be used to select a row electrode 164 and activate a driver corresponding to the selected row electrode 164. The driver for a selected row electrode 164 can drive a corresponding row electrode 164 with different voltages corresponding to a vector-matrix multiplication or the process of setting resistance values within the memristive elements 168 of the crossbar array 162. Similar driver and decoder circuitry may be included for the column electrodes 166. Control circuitry may also be used to control application of voltages at the inputs and reading of voltages at the outputs of DPE 160. Digital to analog circuitry and analog to digital circuitry may be used at the vector inputs 170 and at the vector output 174. Input signals to the row electrodes 164 and column electrodes 166 can be either analog or digital. The peripheral circuitry above described can be fabricated using semiconductor processing techniques in the same integrated structure or semiconductor die as the crossbar array 162 in the above example. As described in further detail below, there are at least two main operations that occur during operation of DPE 160 when used according to disclosed embodiments. The first operation is to program the memristors in the crossbar array so as to map the mathematic values in an N×M matrix to the array. In one example, only one memristor is programmed at a time during the programming operation. The second operation is the dot-product or matrix multiplication operation. In this operation, input voltages are applied and output voltages obtained, corresponding to the result of multiplying an N×M matrix by an N×1 vector. The input voltages are below the threshold of the programming voltages so the resistance values of the memristors in the array 162 are not changed during the matrix multiplication operation.

In one example of a dot-product engine operation according to the principles described herein, vector and matrix multiplications may be executed through the dot-product engine 160 by applying a set of voltages $V^I$ 170 simultaneously along the rows 164 of the N×M crossbar array 162 and collecting the currents through the columns 166 and measuring the output voltage $v^O$ 174. On each column, every input voltage (170) is weighted by the corresponding memristance ($G_{ij}$) and the weighted summation is reflected at the output voltage (174). Using Ohm's law, the relation between the input voltages (170) and output voltages (174) can be represented by a vector matrix multiplication of the form: $\{V^O\}^T = -\{V^I\}^T [G] R_s$, where $G_{ij}$ is an N×M matrix determined by the conductance (inverse of resistance) of the crossbar array 162, $R_s$ is the resistance value of the sense amplifiers and T denotes the transpose of the column vectors $v^O$ and $V^I$. The negative sign follows from use of a negative feedback operational amplifier in the sense amplifiers. From the foregoing, it follows that DPE 160 may be utilized for vector processing and, more specifically, for multiplying a first vector of values $\{b_i\}^T$ by a matrix of values $[a_{ij}]$ to obtain a second vector of values $\{c_i\}^T$, where i=1,N and j=1,M. The vector operation can be set forth in more detail as shown in Equation 1 represented below.

$$a_{11}b_1 + a_{21}b_2 + \ldots + a_{N1}b_N = c_1$$

$$\ldots$$

$$a_{1M}b_1 + a_{2M}b_2 + \ldots + a_{NM}b_N = C_M \quad \text{Equation 1}$$

The vector processing or multiplication using the principles described herein generally starts by mapping a matrix of values $[a_{ij}]$ onto the crossbar array 162 or, stated otherwise, programming—e.g., writing—conductance values $G_{ij}$ into the crossbar junctions of the array 162. With reference still to FIG. 1B, in one example, each of the conductance values $G_{ij}$ is set by sequentially imposing a voltage drop over each of the crossbar junctions. For example, the conductance value $G_{2,3}$ may be set by applying a voltage equal to $V_{Row2}$ at the 2nd row of the crossbar array 162 and a voltage equal to $V_{Col3}$ at the 3rd column of the array 162. In one example, the voltage input, $V_{Row2}$, will be applied to the 2nd row at a location 190 occurring at the 2nd row electrode adjacent the j=1 column electrode. The voltage input, $V_{Col3}$, will be applied to the 3rd column electrode adjacent either the i=1 or i=N location. Note that when applying a voltage at a column electrode 166, the sense circuitry 176 for that electrode may be switched out and a voltage driver switched in. The voltage difference $V_{Row2} - V_{Col3}$ may be used to determine the resulting conductance value $G_{2,3}$ based on the characteristics of the memristive element 168 located at the intersection. When following this approach, the unselected columns 166 and rows may be addressed according to one of several schemes, including, for example, using them as part of the disclosed ECC technique, floating all unselected columns 166 and rows 164, or grounding all unselected columns 166 and rows 164. Other schemes involve grounding columns 166 or grounding partial columns 166. Grounding all unselected columns 166 and rows 164 may be beneficial in that the scheme helps to isolate the unselected columns 166 and rows 164 to minimize the sneak path currents to the selected output column 166. Following programming, operation of DPE proceeds by applying the vector of input voltages 170 and reading the vector of output voltages 174.

In accordance with one example of the principles disclosed herein, the memristors used for DPE 160 have a linear current-voltage relation. Linear current-voltage relations permit higher accuracy in the vector multiplication process. However, crossbar arrays 162 having linear memristors are prone to having large sneak path currents during programming of the array 162, particularly when the size of the crossbar array 162 is larger than a certain size, for instance, 32×32. In such cases, the current running through a selected memristor may not be sufficient to program the memristor because most of the current runs through the sneak paths. Alternatively, the memristor may be unintentionally programmed at an inaccurate value because of the sneak paths. To alleviate the sneak path currents in such instances, and especially when larger arrays are desired, an access device, such as a non-linear selector or transistor (e.g., a normally ON depletion mode transistor) may be incorporated within or utilized together with the memristive element 168 to minimize the sneak path currents in the array. More specifically, the memristive element 168 should be broadly interpreted to include memristive devices including, for example, a memristor, a memristor and selector, or a memristor and transistor.

Figure 2:
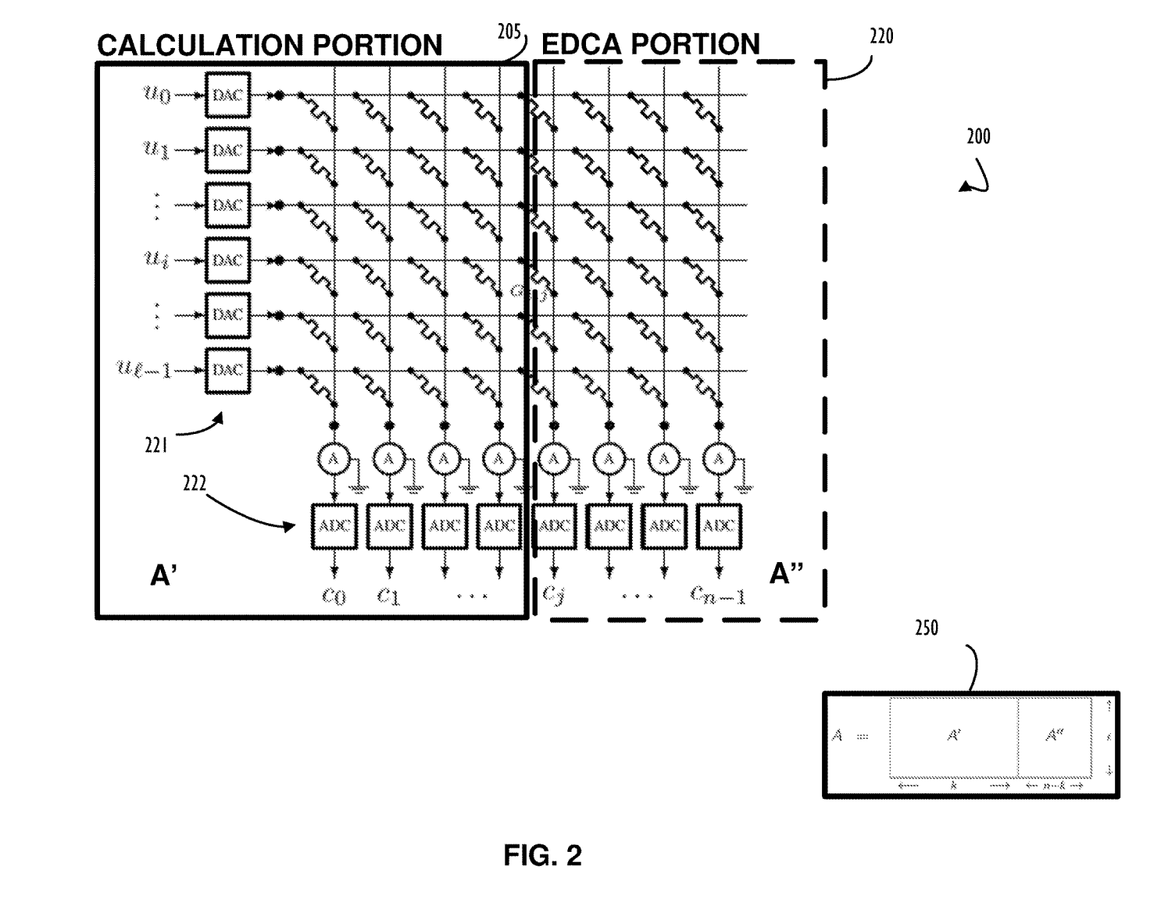
FIG. 2 is a diagram illustrating a division of a crossbar matrix of a DPE with a calculation portion (e.g., matrix multiplication portion) and an ECC calculation portion, according to one or more disclosed embodiments.

Referring now to FIG. 2, dot-product engine internals 200 are illustrated as an example of a crossbar array (e.g., dot-product engine 160 of FIG. 1) and one possible implementation of an input matrix A' 205 representing one of two matrices for which a dot-product MVM calculation may be performed. Also shown is an error detecting correction portion (EDCA portion) 220 (e.g., for an ECC calculation) which, in this example, is represented as utilizing four additional columns of the crossbar array. In this example, an area corresponding to A' 205 would be used to calculate a dot-product of two matrices and concurrently with that calculation, area A" (i.e., EDCA 220) would be used to calculate an ECC for the representative results of the A' calculation. That is, area A" may provide error correcting capabilities for the analog computation performed by the lattice structure of A' (e.g., a portion of a DPE crossbar). The possible size (and relative size) of the areas A' and A" is illustrated in block 250. In this example, there is a total area of A in the crossbar structure with, in this example "n" columns on a given DPE crossbar, area A' may take the first "k" columns leaving an area of "n–k" columns for area A". As discussed herein, a total area of a crossbar matrix may not be required to perform matrix operations where the size of the matrices do not have enough input rows/columns for the entire area. Accordingly, only a portion of the entire crossbar may be supplied power and utilized in any given calculation. Thus, using an area of "n–k" for area A" represents a maximum area to achieve a "highest" level of dynamic ECC available for this particular example. See FIG. 4 below for further discussion of row/column allocation.

As explained above and further illustrated in DPE 200, a crossbar array may include " $\ell$ " row electrodes and "n" column electrodes. The crossbar junctions throughout the crossbar array 200 include a memristive element at each intersection. The dot-product engine 160 includes a vector input register or vector input for applying voltages to the row electrodes and a vector output register or vector output for receiving output voltages resulting from current flows in the column electrodes. Additionally, the dot-product engine (e.g., 160 or 200) may include input registers for columns to adjust the columns conductance (e.g., program the crossbar array for conductance values representative of a first input matrix).

The vector input may be coupled to digital to analog convertors (DAC) 221 to convert digital values to analog values for writing to the crossbar array 160 or 200. The vector output may include analog to digital converters (ADCs) 222 to convert analog values to digital values. The dot-product engine 200 may also include sense circuitry for converting an electrical current in a column electrode to a voltage. In an example, the sense circuitry may include an operational amplifier and a resistor, which can be arranged to represent a virtual ground for read operations.

Dot-product engine 200 may also include other peripheral circuitry associated with crossbar arrays used as storage devices. For example, the vector input may include drivers connected to the row electrodes. An address decoder can be used to select a row electrode and activate a driver corresponding to the selected row electrode. The driver for a selected row electrode can drive a corresponding row electrode with different voltages corresponding to a vector-matrix multiplication or the process of setting resistance values within the memristive elements of the crossbar array (again programming values representative of a first input matrix). Similar driver and decoder circuitry may be included for the column electrodes.

Control circuitry may also be used to control application of voltages at the inputs and reading of voltages at the outputs of the dot-product engine 200. Digital to analog circuitry 221 and analog to digital circuitry 222 may be used at the vector inputs and at the vector output. Input signals to the row electrodes and column electrodes can be either analog or digital. The peripheral circuitry above described can be fabricated using semiconductor processing techniques in the same integrated structure or semiconductor die as the crossbar array 200 in the above example. As described in further detail below, there are at least three main operations that occur during operation of the dot-product engine with the disclosed ECC capability in some implementations of this disclosure. The first operation is to program the memristors in the crossbar array so as to map the mathematic values in an N×M matrix to the array (e.g., set conductance at a crossbar junction). In one example, only one memristor is programmed at a time during the programming operation. The second operation is the dot-product or matrix multiplication operation (which is performed concurrently with the third operation of the ECC computation). To perform a matrix multiplication on a DPE, input voltages are applied, and output voltages obtained, corresponding to the result of multiplying an N×M matrix by an N×1 vector. The input voltages may be configured to be below the threshold of the programming voltages so the resistance values of the memristors as programmed into the array (e.g., input matrix 1) are not changed during the matrix multiplication operation.

The dot-product engine 200 may include analog-to-digital converters 222 to convert analog signals of the vector output register to digital values. The dot-product engine 200 may include digital-to-analog converters 221 to convert digital values to an analog value for the column input register. The dot-product engine 200 may include a digital-to-analog converter to convert digital values to analog values for the vector input register.

As explained above with reference to FIGS. 1A-B, input to the vector input register may be a vector of voltages (e.g., representative of input matrix 2 below the programming threshold and input matrix 1 at above the programming threshold). Input to the column input register may be an array of conductances. The vector output register may be a vector of currents.

The dot-product engine 200 may be electronically coupled to one or more additional processors, shift registers, or memory areas, etc. (see FIG. 1). Portions of the crossbar array that are not used for matrix multiplication may be concurrently utilized for ECC calculation to provide corrective capability for a corresponding matrix operation. For example, EDCA portion 220 may be an ECC area for area 205 of FIG. 2. As explained above, the dot-product system may include at least three modes of operation: 1) dot-product computation, 2) programming memristor array analog values and 3) ECC computation (concurrently with dot-product computation). If an array of voltage signals is applied to the rows of a crossbar via vector input, the current measured at a column will be a weighted summation of the inputs with each input being multiplied by the conductance or 'weight' of the corresponding cross-point memristive device. Multiply-add operation may be performed concurrently in all the layers and the resulting currents are summed at the output using CMOS circuitry. ECC calculations may be applied as appropriate for in situ ECC determination. For example, ECC calculations may be applied after the ECC computation is applied concurrently on the crossbar with the dot-product computation.

As explained above, in some disclosed implementations of a DPE, the matrix A is realized as a crossbar array consisting of $\ell$ row conductors, n columns conductors, and programmable nanoscale resistors (e.g., memristors) at the junctions, with the resistor at the junction (i, j) set to have conductance, $G_{i,j}$, that is proportional to $a_{i,j}$. Each entry $u_i$ of u is fed into a digital-to-analog converter (DAC) to produce a voltage level that is proportional to $u_i$. The product, uA, may then be computed by reading the currents at the (grounded) column conductors, after being fed into analog-to-digital converters (ADCs).

Inaccuracies while programming the resistors in the crossbar and noise while reading the currents are examples of factors that can affect the accuracy of the computation. Specifically, the actually-read row vector, may differ from the correct vector, and an error correction vector may be calculated by using the in situ calculations of rows and column values represented by are A" in EDCA 220.

Another source of computational errors could be junctions in the crossbar becoming shorted due to faults in the programming process. In this case, the current read in the shorted column will be above some compliance limit ("∞"), which, in turn, will flag the respective entry in y as "unavailable" or as an erasure.

In the other extreme, a junction in the array may become non-programmable or get stuck at an open state, in which cases the respective entry in y could be off the correct value by a defined range. Such errors could be counted through their contribution to the error vector. Alternatively, if this type of error is predominant, a Hamming metric may be considered instead, whereby the figure of merit is the Hamming weight of e, equaling the number of positions in which y differs from uA (disregarding the extent at which the values of the respective entries actually differ). This Hamming metric is suitable for handling erasures as well.

In this example implementation, methods for using the DPE computational power to self-protect the computations against errors are used. The first k (<n) entries in c=uA will carry the (ordinary) result of the computation of interest, while the remaining n−k entries of c will contain redundancy symbols, which can be used to detect or correct computational errors, assuming that the number of the latter (counted with respect to either the L1-metric or the Hamming metric) is bounded from above by some design parameter. Specifically, the programmed $\ell \times n$ matrix A will have the structure A=(A'|A"), where A' is an $\ell \times k$ matrix over $\Sigma q$ consisting of the first k columns of A, and A" consists of the remaining n−k columns; the computed output row vector for an input vector $u \in \Sigma \ell q$ will then be c=(c'|c"), where the k-prefix c'=uA' ($\in Zk$) represents the target computation while the (n−k)-suffix c"=uA" ($\in Zn-k$) is the error correcting part. In this setting, A' and u are the actual inputs, and A" may be computed from A', e.g., by a dedicated circuitry, prior to—or while—programming A' and A" into the crossbar array (yet recall that it is expected that A' may be modified much less frequently than u). The error decoding mechanism may be implemented by dedicated circuitry as well as software (or a combination of both). In general, A" may be calculated to be a parity check matrix (in a case of single error detection). For error correction (rather than only detection), an implementation may require a different calculation (error correcting scheme) of A". In some ECCs with tunable tolerable error may require calculation of a different parity-check matrix having the size of the parity-check matrix dependent on the max tolerable error. Thus, disclosed DPE implementations that allow a variable size of A" may be used to implement one or more of these techniques and dynamically change A" size based on calculation requirements.

As illustrated in block 250, each row A may be made up of an area A' and A" with A' being of length k and A" being up to a maximum length of n−k. The initial values programmed into the crossbar array A" depend on A' and the desired level of error correction. c'=uA' of length k: representing the desired computation; c"=uA" of length n−k: representing an error correcting component for ECC correction of c'; and A" depends on A' but not on u. Thus, using the disclosed techniques, the DPE may "self-protect" against errors. Further, for optimizing efficiency of resources including crossbar area and power, a goal may be to minimize n−k given the designed error correction capability.

Figure 6:
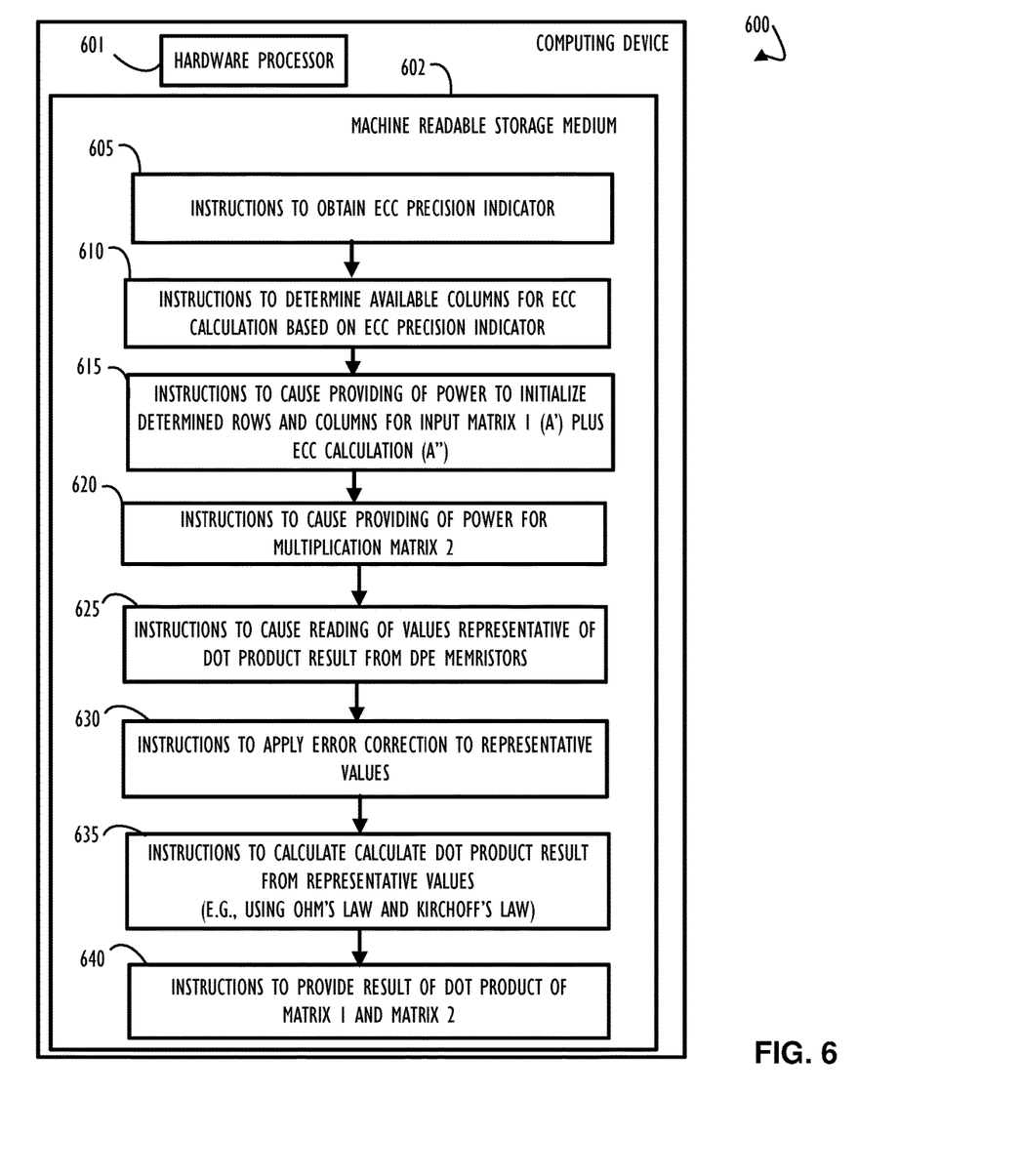
FIG. 6 is an example computing device with a hardware processor and accessible machine-readable instructions for performing ECC with a memristor crossbar, according to one or more disclosed embodiments.

A machine-readable storage medium, such as 602 of FIG. 6, may include both volatile and nonvolatile, removable and non-removable media, and may be any electronic, magnetic, optical, or other physical storage device that contains or stores executable instructions, data structures, program module, or other data accessible to a processor, for example firmware, erasable programmable read-only memory (EPROM), random access memory (RAM), non-volatile random access memory (NVRAM), optical disk, solid state drive (SSD), flash memory chips, and the like. The machine-readable storage medium may be a non-transitory storage medium, where the term "non-transitory" does not encompass transitory propagating signals.

Figure 3:
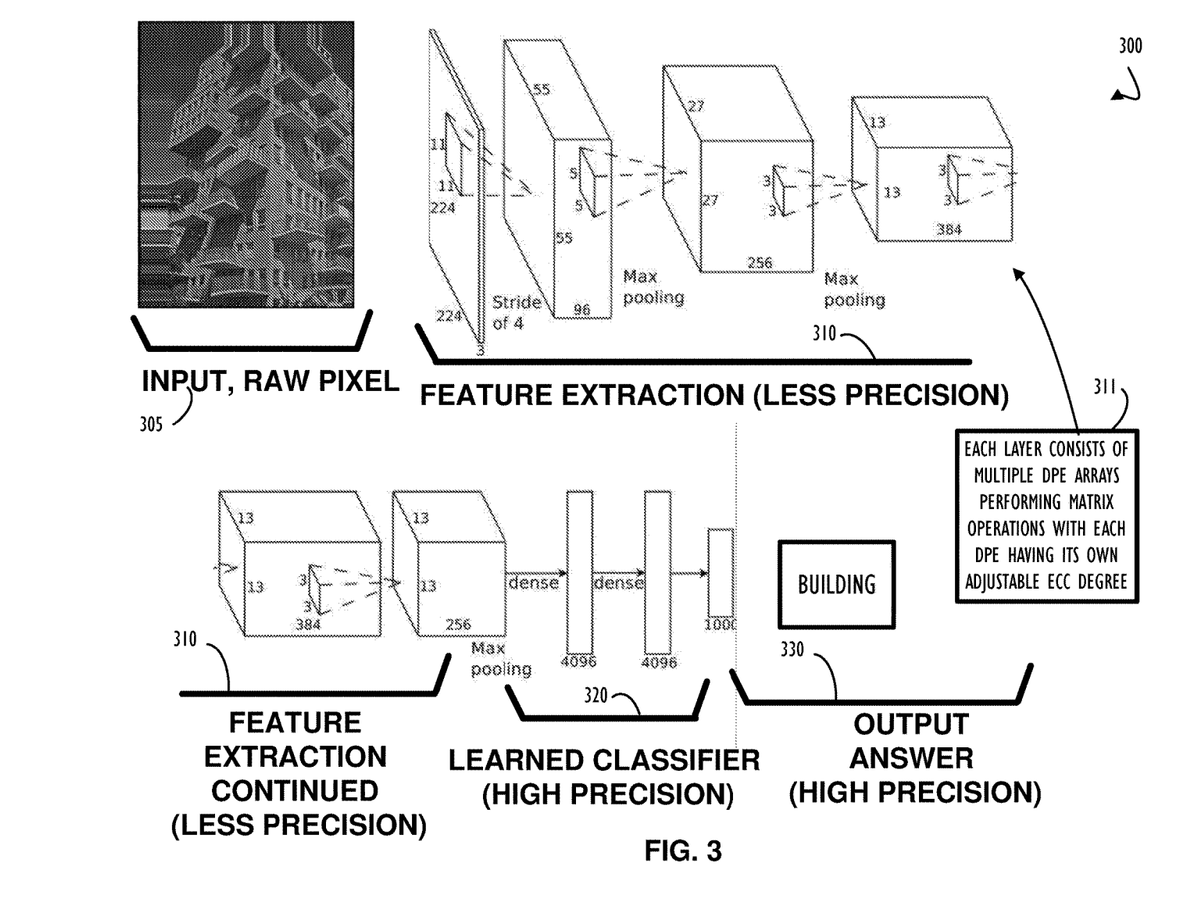
FIG. 3 illustrates an image processing process with multiple steps where different steps in the image processing pipeline may utilize different levels of precision and therefore different levels of ECC degree, according to one or more disclosed embodiments.

With reference to FIG. 3, the disclosed approach to ECC for DPE processors may provide a dynamic means to adjust the computational precision on a per-layer basis. The multi-layers may refer to stages in a computational pipeline, such as in Neural Network computations or the image processing pipeline 300. In these cases, as well as others, some lower layers (e.g., feature extraction 310) can be much less precise than higher layers (fully-connected classifying layers 320). Image processing pipeline 300 represents an example of a set of related computational stages that may work together (in series or in parallel) to produce an overall result. In the image processing example, the process may begin with input of raw pixel data (305). After the raw pixel data is obtained, a feature extraction process 310 may be performed to determine attributes of the image being processed. As illustrated in pipeline 300, the feature extraction process may include a number of different calculations, perhaps on different portions of the input image, and result in an overall set of features extracted from the input image. After feature extraction 310 is completed (possibly with a low degree of ECC), a learned classifier process 320 may be performed. As in this example, learned classifier process 320 may be performed with a high degree of precision and therefore more ECC processing than was used for calculations performing feature extraction 310. Finally, an output answer 330 may be calculated (again with a high precision setting for ECC). Thus, the application developer, or prepared libraries, may request a desired level of ECC degree for different calculations based on a degree of accuracy required with respect to the overall result accuracy.

To summarize, disclosed techniques for ECC calculations on a DPE crossbar may be inherently implemented in DPE crossbars in the hardware (e.g., calculations may be performed in situ). Accordingly, the disclosed implementation alleviates a need for additional circuitry/offline calculations (as used in other possible techniques) to implement ECC or change the degree of error correction (T, Δ). Dynamic adjustment of error correction amount depending on the user's required precision and error tolerance may allow for an optimal performance-accuracy tradeoff when applying ECC's. One example of dynamic adjustment may implemented by having many possible ECC's (correction schemes) already programmed in the DPE. For example, a first ECC of single error detection (using a small A"), a second ECC for error correction, and a third ECC having an adjustable tolerable error value. Then, the DPE can dynamically choose which ECC to apply based on which A" it activates via the column current measurement path (and therefore which ECC is implemented for a given calculation). As mentioned above, schemes may be "pre-programmed" into the DPE may be implemented by dedicated hardware or may be implemented in software.

Because the computations are performed in the analog domain, "errors" can also be thought of as noise. Certain analog calculations using analog devices, such as a DPE, may be subject to different layers of a computational workload injecting less or more noise to their calculations. For some applications such as optimization problems, the ability to add noise leads to more robust final answers. The disclosed devices and methods of use may allow a controllable, dynamic, and spatially-varying amount of noise to be added without necessarily losing desired accuracy of an overall result.

Figure 4:
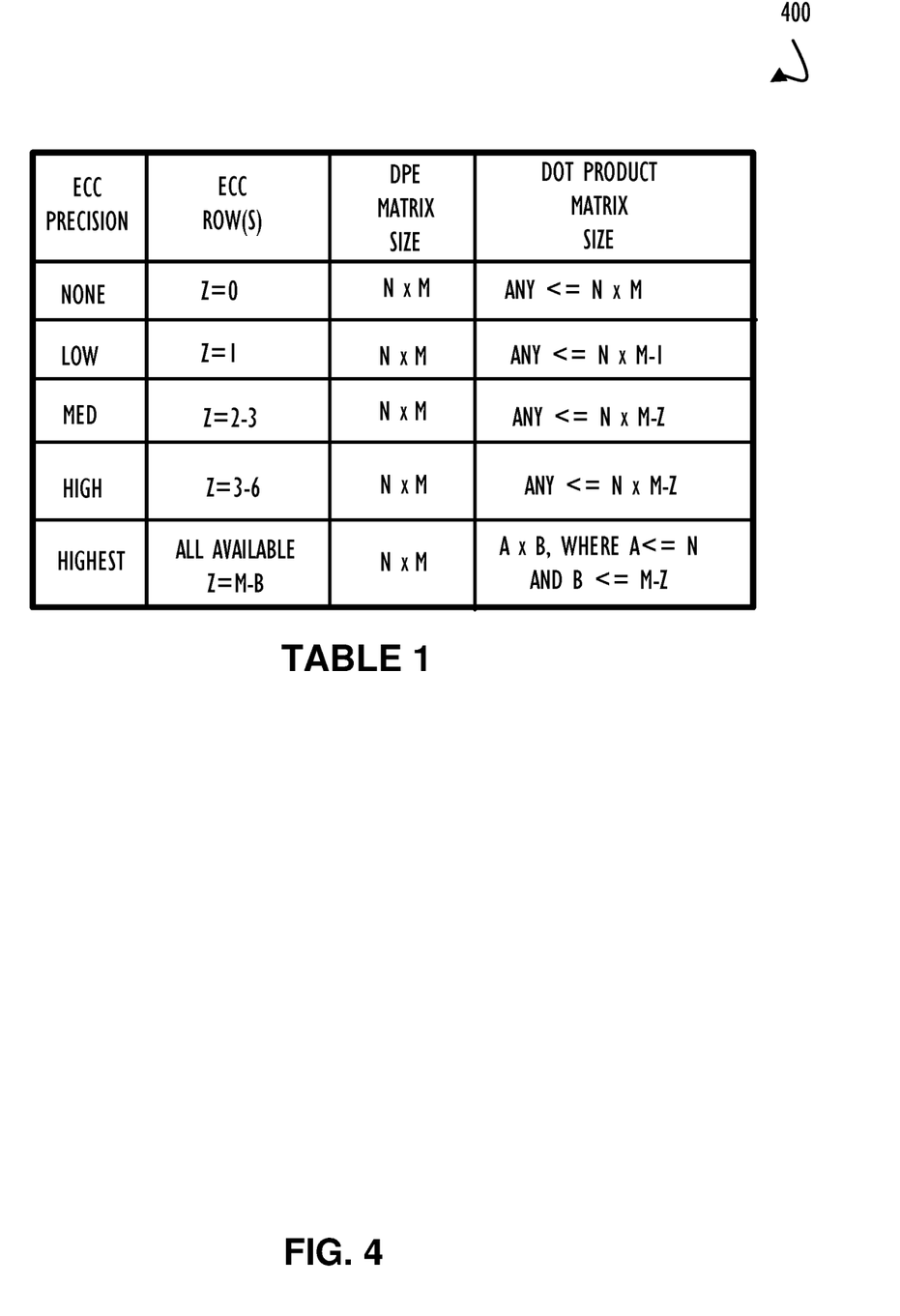
FIG. 4 illustrates a table explaining an example partitioning of a DPE crossbar matrix between dot-product calculation portions and ECC calculation portions based on different degrees of ECC precision, according to one or more disclosed embodiments.

FIG. 4 illustrates Table 1 (400) that provides examples of how different ECC precision may be requested by a user or application library. For example, if an ECC precision of "none" is requested, the number of columns allocated (and programmed/powered) will be zero (represented by Z=0). Accordingly, all available rows/columns of a DPE crossbar (represented as N×M in this example) may be made available for dot-product calculations and the calculation matrix size may take up the entire crossbar array. If a "low" degree of precision is requested then a single ECC column may be allocated (i.e., Z=1) and a single column of the crossbar would be used for ECC leaving M−1 columns for the maximum size of the matrix for the dot-product operation. As a next example, a "medium" level of accuracy is requested, therefore 2-3 columns may be used for ECC leaving available area on the crossbar array for dot-product calculation. A "high" degree of accuracy would increase the ECC area over the medium level. Finally, a "highest" degree of precision could be requested, in which case the size of the input matrices could be used to calculate the dot-product area requirement and all remaining columns may be dedicated to the ECC portion of the calculation. Of course, the above levels and associated names for those levels are only examples. Different terminology and different amounts of areas on the crossbar may be allocated using different numbers than these examples. At a high level, this may be thought of as providing different degrees of error correction for different computations (in particular NN layers). In general, correction of t errors can be achieved with column redundancy of t*ceiling(log q(2m+1)) where q is the range of values in A' (the desired matrix for the DPE computation) and m is the total number of available columns in the DPE array.

Figure 5:
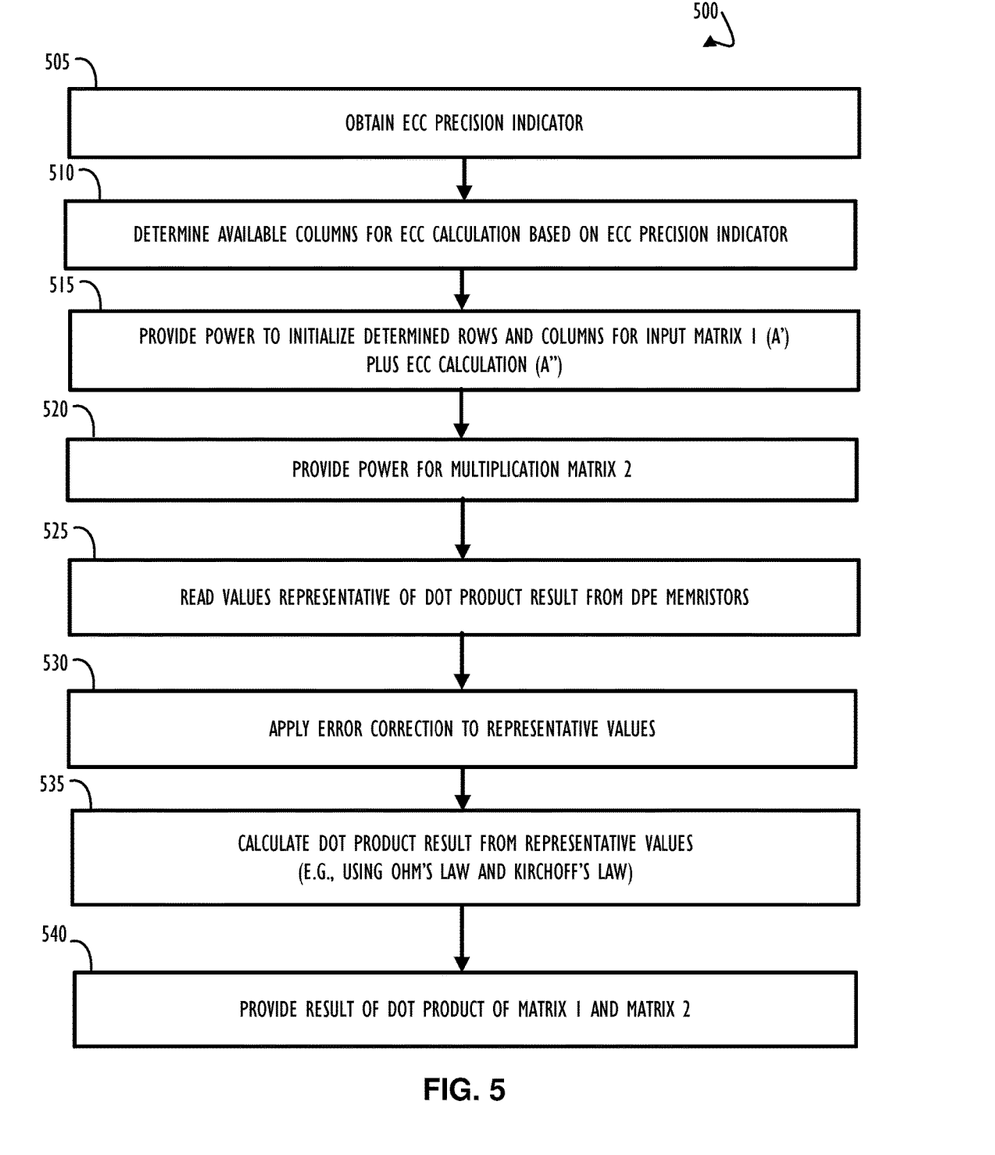
FIG. 5 illustrates a flowchart of an example method of performing a tunable and dynamically adjustable error correction for a memristor crossbar, according to one or more disclosed embodiments.

FIG. 5 is an example method 500 that may be executed on a computing device having both a processor (e.g., general purpose processor) and a DPE that may be used as an accelerator for matrix multiplication, according to one or more disclosed embodiments. For example, method 500 may be used as part of a digital image processing pipeline as discussed above in FIG. 3. In that example, method 500 may be repeated multiple times for each "phase" of the processing at different stages of the pipeline. In areas of computation that need more accuracy, the obtained ECC precision indicator (block 505) may be higher and therefore utilize more rows/columns of the DPE crossbar for error correction (refer to FIG. 4 discussed above). In contrast, areas of processing that need less accuracy may benefit from "improved" overhead by reducing the number of rows/columns to a number near the number required for the matrix calculation itself. In general, disclosed embodiments allow a system to dynamically adjust its accuracy to affect one of the performance "levers" commonly referred to as: "area," "power," and "accuracy," which each compete for system resources. For example, "power" and "area" may be increased to increase "accuracy" when more calculations are being performed, but "power" may be conserved (perhaps resulting in a longer expected battery life for a portable device) when a lesser degree of accuracy will suffice for a specific calculation. Thus, the disclosed techniques represent an improvement to the technological field of computational accuracy and efficiency by providing additional flexibility to an end-user (e.g., program designer).

Method 500 begins at block 505 where, the method obtains an ECC precision indicator (e.g., a desired degree of precision (see Table 1 (400) of FIG. 4). Next, at block 510 it may be determined how many available columns for ECC calculation (based on the obtained ECC precision indicator) may be included in the instant calculation. If some rows/columns are not required for the calculation plus ECC parameters (e.g., not used), the system may simply not supply power to program those crossbar intersections outside the area of calculation, thus resulting in an expected power saving for the device. Block 615 indicates that the device may, in accordance with what has been determined previously as far as ECC overhead, cause providing of power to initialize determined rows and columns for an input matrix 1 (A') plus ECC calculation (A"). As indicated by block 520, the system may further cause (e.g., using instructions from a processing device to control other portions of a system) providing of power for multiplication matrix 2 (e.g., apply voltage inputs to a programmed DPE crossbar). Block 525 indicates that method 500 may next cause reading of values representative of dot-product result (matrix multiplication) from DPE memristors. Block 530 indicates that once representative values are obtained (or as part of the process of obtaining them from the crossbar), method 500 calls for applying error correction to those representative values. Note that sometimes only error detection (rather than correction is desired). Of course, correction may take an additional decoding step of the measurement output operation, and thus correction may: 1) not always be possible depending on the redundancy programmed; and 2) may not be desired by the user (e.g., if detection vs. correction suffices). Block 535 indicates that a resultant dot-product calculation of matrix 1 and matrix 2 may be determined from representative (possibly corrected) values. Finally, for example method 500, results of the overall calculation (and error correction) may be provided as indicated by block 540. Note, that in method 500 ECC calculations may be performed "as part of" and concurrently with the dot-product matrix multiplication. Accordingly, this represents in situ ECC calculation that may reduce computational (and other resource) overhead. Further, in some implementations a constant set of values for Matrix 1 may be used and the overhead to initialize the DPE matrix may be reduced by leveraging the consistency of the values of this matrix.

In general, some disclosed implementations may use the measured DPE result from the A" columns (sometimes in addition to the result from the A' columns as well) to determine at least two cases. In a first case, it may be determined whether there is an error or not in the DPE measurement. This is simply a binary determination so that different events may occur. For example, a software application may implement re-try logic to perform the calculation a second time when an error is detected; the DPE may purge and reload the initial input matrix to "refresh" the data that may be persistently stored in the memristors; a core/tile exhibiting persistent errors may be disabled so that other cores/tiles are used for future calculations, or if error correction (not just detection) is possible, to proceed with the correction and flag that core for future scrubbing, other actions are also possible depending on the implementation.

In a simple implementation of error detection only, the calculation may be performed in a completely redundant manner on the DPE such that the input matrix is stored in two independent sets of cells and the calculation is done across all of them. In this example implementation, A" would simply be a complete copy of A'. If the results of the A" calculation do not match the results of the A' calculation, an error has occurred. This implementation, although simple, may not be desirable for at least two reasons. First, the error may actually be in the A" calculation rather than the A' calculation and additional processing would be required to determine which had the error. Second, this implementation essentially doubles the overhead with regard to power and area on the processor. Other implementations exist that do not require full redundancy and allow for adjustable amounts of additional overhead but require more sophisticated determination techniques than the simple comparison of this example.

For the second case determination referenced above (error correction rather than just detection), additional logic may be implemented (e.g., after an error is detected) to attempt to provide a correction to the measured error. Different error correction calculation schemes may work in different ways and require different sizes of A". Accordingly, overhead of the calculation performed by the DPE may be reduced but additional overhead may be added that depends on the "sophistication" of the ECC scheme. The mathematics behind the different ECC schemes is beyond the scope of this disclosure but each of the available algorithms (and future algorithms) would of course benefit because of the flexibility of the disclosed DPE to dynamically adjust the size of A" as needed to implement one or more different schemes. Determination of which type of ECC scheme may depend on the actual implementation based on factors of efficiency, overhead (e.g., area/power on the DPE), and requirements of accuracy for any given implementation.

FIG. 6 is an example computing device 600 with a hardware processor 601, with machine readable instructions 602 for determining and applying ECC techniques at varying degrees of precision with a memristor crossbar array. As described in detail below, the machine-readable storage medium may be encoded with executable instructions 605-640, for performing tunable dynamically adjustable error correction with a memristor crossbar array.

The executable instructions include instructions to: obtain an ECC precision indicator (e.g., a desired degree of precision (see Table 1 (400) of FIG. 4) (block 605); determine available columns for ECC calculation based on ECC precision indicator (block 610); cause providing of power to initialize determined rows and columns for an input matrix 1 (A') plus ECC calculation (A") (block 615); cause providing of power for multiplication matrix 2 (block 620); cause reading of values representative of dot-product result (matrix multiplication) from DPE memristors (block 625); apply error correction to representative values (block 630); calculate dot-product results from representative values (block 635); and provide result of dot-product of matrix 1 and matrix 2 (block 640).

The foregoing description, for purposes of explanation, used specific nomenclature to provide a thorough understanding of the disclosure. However, it will be apparent to one skilled in the art that the specific details are not required to practice the systems and methods described herein. The foregoing descriptions of specific examples are presented for purposes of illustration and description. They are not intended to be exhaustive of or to limit this disclosure to the precise forms described. Obviously, many modifications and variations are possible in view of the above teachings. The examples are shown and described to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

We claim:

1. A memristive dot-product system for vector processing, comprising:
    a crossbar array having a number of memory elements, each memory element comprising a memristor and a transistor in series with one another, the crossbar array having N rows, M columns and N×M memory elements;
    a vector input register comprising N voltage inputs to the crossbar array;
    a vector output register comprising M voltage outputs from the crossbar array; and
    an analog-to-digital converter (ADC) electronically coupled to the vector output register;
    a digital-to-analog converter (DAC) electronically coupled to the vector input register;
    a dot-product matrix vector multiplier processor electronically coupled to the ADC A and to the DAC, the processor configured to:

program a plurality of junction points of the crossbar array with a first set of values corresponding to values of a first input matrix having less than N rows and less than M columns;

program an error detecting or correcting area (EDCA) corresponding to at least one row and column of the crossbar with at least one value for use in an error detecting or correcting code calculation, the EDCA occupying an area of the crossbar not utilized by the first input matrix;

apply voltages to a plurality of rows of the crossbar array, the applied voltages representing a set of data values corresponding to rows of a second input matrix;

read electrical properties of a plurality of columns of the crossbar array, the electrical properties including current or voltage to calculate a dot-product vector result for the set of data values corresponding to the second input matrix and the first input matrix; and calculate a dot-product of the first input matrix and the second input matrix concurrently with calculating error detecting or correcting information in the EDCA of the crossbar.

2. The memristive dot-product system of claim 1, wherein the EDCA is used to perform the error detecting or correcting calculation on the calculated dot-product.

3. The memristive dot-product system of claim 1, wherein a plurality of rows are extended with additional values concurrently with the first set of values, the additional values for use in the error detecting or correcting code calculation.

4. The memristive dot-product system of claim 1, wherein a plurality of columns are programmed for use in the error detecting or correcting code calculation.

5. The memristive dot-product system of claim 1, wherein multiple dot-product results are obtained with different accuracy levels of the error detecting or correcting code calculation.

6. The memristive dot-product system of claim 5, wherein the different accuracy levels of the error detecting or correcting code calculation are achieved through use of varying a number of columns programmed for use in the error detecting or correcting code calculation.

7. The memristive dot-product system of claim 5, wherein the clustering processor is further configured to set a number of columns to be used for the error detecting or correcting code calculation.

8. The memristive dot-product system of claim 1, further comprising a processor communicatively coupled to the crossbar array, wherein the processor is configured to perform post dot-product processing using the error detecting or correcting code calculation to adjust values of the dot-product vector result.

9. A method comprising:

obtaining an error correcting code (ECC) precision indicator;

determining an available error detecting or correcting area (EDCA) of a crossbar array for an ECC calculation corresponding to a dot-product calculation to be performed between a first input matrix and a vector of a second input matrix using the crossbar array;

providing power to initialize the EDCA of the crossbar array concurrently with providing power to initialize the crossbar array with values representative of the first input matrix;

applying the vector of the second input matrix to the crossbar array as voltage row inputs;

reading values representative of a portion of the dot-product calculation from memristors included in the crossbar array;

applying ECC calculations at the obtained ECC precision utilizing indicator values read from the EDCA in addition to the values representative of the dot-product calculation; and providing result of the dot-product calculation of the first input matrix and the second input matrix as adjusted by the ECC calculations.

10. The method of claim 9, wherein the determined rows and columns correspond to an area of the crossbar not utilized by the first input matrix and the determined rows and columns are used to perform ECC calculations on the dot-product calculation.

11. The method of claim 9, wherein a plurality of rows are extended with additional values concurrently with the first set of values, the additional values for use in the ECC calculations.

12. The method of claim 9, wherein a plurality of columns are programmed for use in the ECC calculations.

13. The method of claim 9, wherein multiple dot-product results are obtained with different accuracy levels of the ECC calculations.

14. The method of claim 13, wherein the different accuracy levels of ECC calculations are achieved through use of varying a number of columns programmed for use in the ECC calculations.

15. The method of claim 13, wherein a clustering processor is configured to set a number of columns to be used for the ECC calculations.

16. The method of claim 9, further comprising utilizing a processor communicatively coupled to the crossbar array, wherein the processor is configured to perform post dot-product processing using the ECC calculations to adjust values of the dot-product calculation.

17. A non-transitory computer readable medium comprising computer executable instructions stored thereon that when executed by one or more processing units, perform a method to provide an ECC operation concurrently with a dot-product operation, the method comprising:

obtaining an error correcting code (ECC) precision indicator;

determining an available error detecting or correcting area (EDCA) of a crossbar array for an ECC calculation corresponding to a dot-product calculation to be performed between a first input matrix and a vector of a second input matrix using the crossbar array;

providing power to initialize the EDCA of the crossbar array concurrently with providing power to initialize the crossbar array with values representative of the first input matrix;

applying the vector of the second input matrix to the crossbar array as voltage row inputs;

reading values representative of a portion of the dot-product calculation from memristors included in the crossbar array;

applying ECC calculations at the obtained ECC precision utilizing indicator values read from the EDCA in addition to the values representative of the dot-product calculation; and providing result of the dot-product calculation of the first input matrix and the second input matrix as adjusted by the ECC calculations.

18. The non-transitory computer readable medium of claim 17, wherein the determined EDCA of the crossbar does not overlap with an area of the crossbar occupied by the values representative of the first input matrix and the determined rows and columns are used to perform ECC detection only on the dot-product calculation.

19. The non-transitory computer readable medium of claim 17, wherein a plurality of rows are extended with additional values concurrently with the first set of values, the additional values for use in the ECC calculations.

20. The non-transitory computer readable medium of claim 17, wherein a plurality of columns are programmed for use in the ECC calculations.

* * * * *